United States Patent [19]

Newton

[11] Patent Number: 4,730,235
[45] Date of Patent: Mar. 8, 1988

[54] CASCADABLE CARRIER FOR HIGH POWER SEMICONDUCTORS OR OTHER ELECTRONIC COMPONENTS

[75] Inventor: Charles M. Newton, Budd Lake, N.J.

[73] Assignee: Itek Corporation, Lexington, Mass.

[21] Appl. No.: 3,748

[22] Filed: Jan. 16, 1987

[51] Int. Cl.$^4$ ............................................. H05K 7/20
[52] U.S. Cl. .................................... 361/388; 165/80.3;
165/185; 174/16 HS; 357/87
[58] Field of Search .................. 174/16 HS; 165/80.3,
165/185; 357/81, 81 A, 81 B, 81 C, 75, 80;
361/383–389, 392–394, 396

[56] References Cited

U.S. PATENT DOCUMENTS 3,277,346 10/1966 McAdam et al. ................... 361/384
3,317,797 5/1967 Webb ................................. 361/388
3,697,814 10/1972 Christman et al. ................. 361/388
4,600,968 7/1986 Sekiya et al. ....................... 361/394

Primary Examiner—A. D. Pellinen
Assistant Examiner—Gregory D. Thompson
Attorney, Agent, or Firm—Michael H. Wallach; Robert F. Rotella

[57] ABSTRACT

A carrier for electronic components which generate heat during their operation, such as high power semiconductors, is disclosed. The carrier includes complementary ends which are designed to permit the second end of a first carrier to abut and overlap the first end of a second carrier to conserve space when more than one carrier is mounted on a substrate containing an electronic circuit. Preferably each end of each carrier has an aperture bored therethrough to allow the carrier to be mounted to the substrate with fasteners such as screws. The apertures are located so that the aperture in the second end of a first carrier aligns with the aperture in the first end of a second carrier to permit a first and a second carrier to be fastened to the substrate with a common fastener passing through the aligned apertures. Similarly, the aperture in the second end of a second carrier is positioned to align with an aperture in the first end of another carrier. Thus, multiple carriers may be fastened to a substrate or other mounting surface using fasteners shared by two carriers.

8 Claims, 3 Drawing Figures

CASCADABLE CARRIER FOR HIGH POWER SEMICONDUCTORS OR OTHER ELECTRONIC COMPONENTS

BACKGROUND OF THE INVENTION

1. Field of Invention

This invention relates to mounting arrangements for electronic components in general, and more particularly to an apparatus for mounting high power semiconductors in close proximity to one another.

2. Description of the Prior Art

The use of high power semiconductor devices in electronic circuits is known in the art and such devices may frequently be found in electronic devices which are packaged in small housings. During their operation, however, many electronic components, for example some semiconductors, generate large quantities of heat which must be dissipated to permit the components to operate reliably at high power levels over extended periods of time. One prior known method of dissipating heat generated by some small electronic components which generate large quantities of heat in small areas has involved the fastening of elongated copper bars to the substrate or mounting package on which an electric circuit was fabricated by screws which retained each end of the bar to the substrate or mounting package. Each electronic component which generated large quantities of heat was individually mounted to one of the copper bars by means of a heat conductive paste or epoxy, or by brazing the component to the bar. Heat generated during the operation of the electronic component was conducted into the bar and dissipated away from the electronic component, thus permitting the component to safely operate at its rated power level. One problem with such prior known heat dissipating arrangements is that they occupy considerable space in relation to the size of the components from which they are dissipating heat, and thus require an appreciable amount of mounting space. This space is frequently not available when electronic circuits are being packaged in the very smallest size package possible for use, for example, in space vehicles. Another problem is that prior known mounting bars were mounted to the package housing the electronic circuit by means of screws which fastened each end of the mounting bar to the housing and which helped conduct heat from the bar to the housing, thus requiring that at least two mounting holes be drilled for each mounting bar contained in the housing and that two screws per bar be handled to fasten each bar to the housing.

SUMMARY OF THE INVENTION

Accordingly, it is a primary object of this invention to provide a carrier for high power semiconductors or other electronic components which may be mounted in groups of two or more with minimal effort.

Another object is to provide a carrier for high power semiconductors or other electronic components in which two or more of the carriers may be mounted in a minimal amount of space.

Still another object is to provide a carrier for high power semiconductors or other electronic components which may be mounted in groups to a substrate with a minimal number of fastening devices.

The above and other objects and advantages of the invention are achieved by manufacturing carriers for electronic components with complementary ends which permit adjacent carriers to be overlapped with each other. The overlapped ends of adjacent carriers may be fastened to a substrate or other mounting fixture using a common mounting fastener, thus saving time, space, and fasteners in mounting the carriers to the substrate. Semiconductors or other heat-generating electronic components may be mounted to the carriers to permit heat generated by the components to be absorbed from the components, thereby permitting the electronic components to generate large quantities of heat without the risk of damaging or destroying the electronic components.

DESCRIPTION OF THE DRAWING

The above and other objects and advantages of the invention may be seen by referring to the accompanying drawing in which.

DETAILED DESCRIPTION OF A PREFERRED EMBODIMENT

Figure 1:
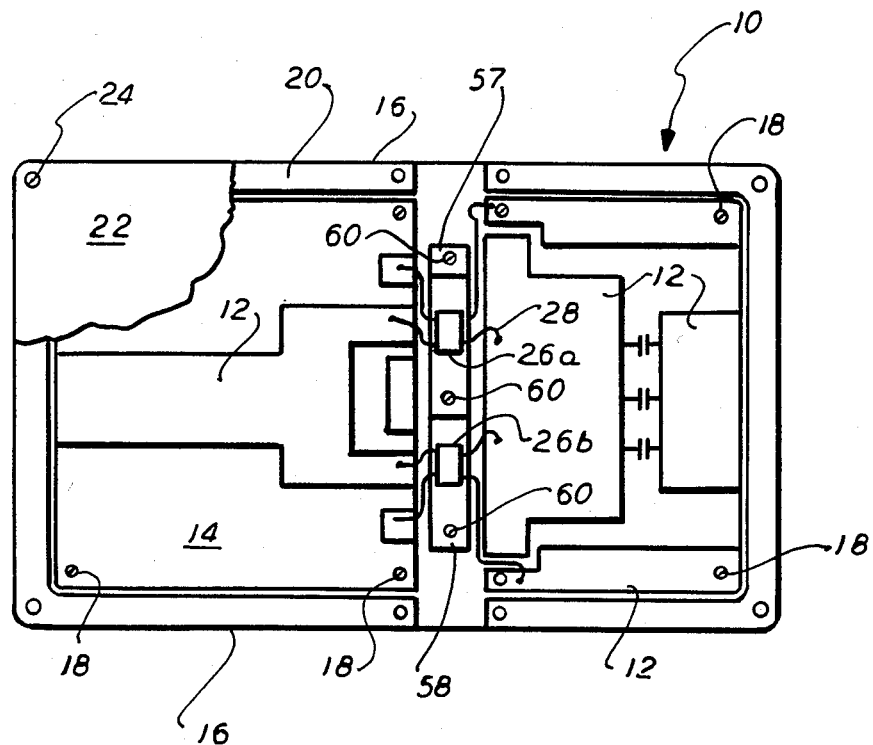
FIG. 1 is a top view of an electronic circiut mounted in a case and having a preferred embodiment of the invention applied thereto.

Referring to the drawing, FIG. 1 shows a preferred embodiment of a carrier for retaining electronic components such as high-power semiconductor, constructed in accordance with the teachings of the invention applied to an electronic device shown generally at 10. The device 10 may be any electronic circuit, for example, a microwave stripline amplifier which is implemented by photolithographic techniques to deposit conductor paths 12 on a hard substrate 14. Representative substrate materials include alumina and beryllium oxide. The substrate may be fastened within an enclosure 16 using the screws 18. The enclosure 16 may be manufactured from material such as aluminum and may include walls 20 to which a cover 22, shown broken away, may be fastened using fasteners, such as the screw 24. Preferably the circuit may include one or more heat-generating electronic components, such as the semiconductor devices 26a and 26b which are electronically connected to the circuit by the leads 28.

Figure 2:
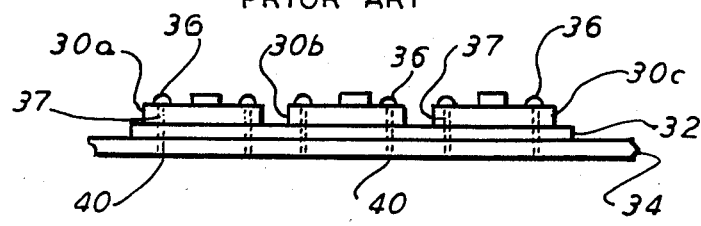
FIG. 2 is a view of three prior art heat sinks mounted on a substrate.

During the operation of the circuit, the semiconductor devices generate considerable heat which must be removed from the devices to prevent their failure. It is known in the art that such devices may have heat conducted away therefrom by mounting the devices on heat sinks. For example, FIG. 2 shows three prior art heat sinks 30a, 30b, and 30c mounted on a substrate 32. The prior art heat sinks 30a, 30b and 30c are fastened through the substrate 32 to a portion of a mounting case 34 using screws 36 which pass through holes 37 in each end of each of the heat sinks. Each of the heat sinks 30a, 30b and 30c are independently mounted to the substrate 32 and each requires a pair of mounting screws 36 to rigidly mount the heat sinks and to provide a heat-conductive path between each heat sink and the mounting case 34. Thus, it can be seen that a limitation of the prior art heat sinks is that each heat sink requires a separate pair of mounting screws, a separate pair of apertures 30 through the substrate, and a separate pair of threaded apertures 40 in the mounting case. Furthermore, assembly of the heat sinks to the electronic circuit requires that additional time be consumed in locating the heat sinks on the substrate and fastening each of the heat sinks using two screws per heat sink. It can readily be appreciated that in applications where many electronic components which generate heat are mounted on a relatively small substrate, the effort involved in finding space for, and mounting many heat sinks on a substrate having many components mounted thereon, becomes appreciable.

Figure 3:
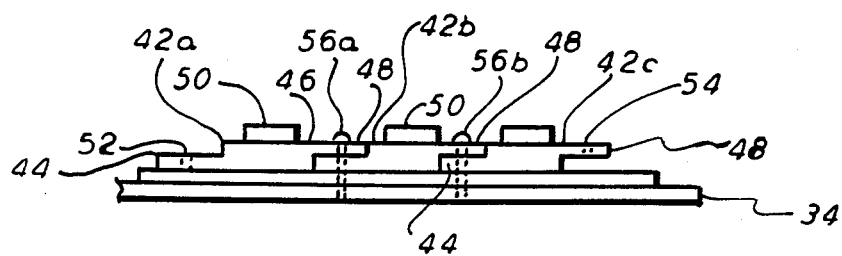
FIG. 3 is a detailed view of three carriers for electronic compenents constructed in accordance with the invention mounted on a substrate.

The problems of the prior art are overcome by the carriers 42a, 42b, and 42c shown generally in FIG. 3. Each of the carriers includes a first stepped end portion 44, a central body portion 46, and a second stepped end portion 48. In the preferred embodiment, the body portion 46 includes a raised mounting area 50 on which an electronic component, such as a semiconductor, may be mounted. The first stepped end portion 44 and the second stepped end portion 48 each have holes passing therethrough, for example the hole 52 in the first end 44 and the hole 54 in the second end 48.

As shown in FIG. 3, the height and length of the first stepped end 44 are chosen to complement the height and length of the second stepped end 48 to permit a second stepped end 48 of a first carrier, for example carrier 42a, to overlap a first stepped end 44 of a second carrier, for example carrier 42b. The location of the hole 52 in the first stepped end 44 is chosen so that it coincides with the location of the hole 54 in the second stepped end 48 when the second stepped end 48 of the first carrier overlies the first stepped end 44 of a second carrier. Preferably the carriers are manufactured from a material which has a high thermal conductivity, for example copper or an alloy of beryllium-copper.

FIG. 3 also shows how multiple carriers, for example carriers 42a, 42b, and 42c may be fastened to a mounting case 34 using a minimum number of screws 56. For example, due to the overlap of the second stepped end of carrier 42a with the first stepped end of carrier 42b, only one mounting screw 56a is required to fasten the two carriers 42a and 42b to the case 34. Similarly, only a second mounting screw 56b is required to retain carrier 42c, whose first stepped end 44 is overlapped by the second stepped end 48 of carrier 42c. Thus, as shown in FIG. 3, only two mounting screws are required to retain the three carriers 42a, 42b, and 42c to the case 34. Obviously, this arrangement results in substantial savings in time and mounting effort where increased numbers of carriers are to be mounted to a substrate. In the case of just three carriers the savings may be seen by reference to FIG. 2, an example of three prior art heat sinks, where six screws are required to retain the heat sinks 30a, 30b, and 30c to the mounting case 34.

FIG. 1 shows how the carriers which are the subject matter of the present invention may be applied to the electronic device 10. Electronic component 26a is mounted to carrier 57 and electronic component 26b is mounted to carrier 58. Three screws 60 are used to fasten the two carriers to the enclosure 16. The electronic components 26a and 26b are fastened respectively to carrier 57 and 58 by brazing or by the use of a heat-conducting epoxy. Heat generated by the components 26a and 26b during the operation of the device 10 is conducted by the carriers away from the components, thereby permitting the components to operate without jeopardizing their operation due to thermal-induced failure.

What has been described is a preferred embodiment of a carrier for electronic components which permits components which generate large quantities of heat during their operation to be easily mounted in close proximity to each other on circuit boards. Other variations of the carrier described herein may become obvious to those skilled in the art in view of the teachings contained herein. For example, the ends of the carrier may be arranged as complementary inclined planes, to permit the first end of a second carrier to be mated against and overlie the second end of a first carrier. It is intended that such variations be included within the scope of the invention and that the invention only be limited by the scope of the appended claims.

I claim:

1. In an electronic circuit having two or more electronic components which generate heat as a byproduct of their operation, the electronic circuit being mounted to a retaining means, at least two carriers for mounting said electronic components to said retaining means, each of said carriers permitting heat generated during the operation of each of said electronic components to be conducted away from said electronic components, each of said carriers having a body portion to which a one of said electronic components may be mounted and a first stepped end at a first end of said body portion and a second stepped end at a second end of said body portion, said first stepped end and said second stepped end being constructed so that the second stepped end of a one of said carriers overlies and contacts the first stepped end of another one of said carriers when two of said carriers are mounted in contact with each other on said retaining means, said carriers being retained to said retaining means by at least a fastener common to both of said carriers.

2. The electronic circuit set forth in claim 1 wherein said first stepped end and said second stepped end of each carrier each have an aperture passing therethrough, said aperture in said second stepped end being located so as to overlie the aperture in said first stepped end when a first carrier having a second stepped end is placed against a second carrier having a first stepped end.

3. The electronic circuit set forth in claim 2 wherein the body portion of each of said carriers includes a raised portion for mounting an electronic component thereto.

4. The electronic circuit set forth in claim 2 wherein each of said carriers is manufactured from an alloy containing copper.

5. In an electronic circuit contained in a package, the package including a retaining means, said electronic circuit having two or more electronic components which generate heat as a byproduct of the operation of said electronic components, at least two carriers for mounting said electronic components to said retaining means, each of said carriers having a central body portion with a first end portion and a second end portion, said first end portion being located at a first end of said body portion and said second end portion being located at a second end of said body portion, said first end portion and said second end portion being shaped so that the second end portion of one of said carriers abuts and at least partially overlies the first end portion of another of said carriers when one of said carriers is mounted against another of said carriers and said carriers are mounted to said retaining means, with two of said carriers being retained to said retaining means by at least a fastener common to both of said carriers.

6. The electric circuit set forth in claim 5 wherein said first end portion and said second end portion of each carrier each have apertures passing therethrough, said aperture in said first end portion being located so as to be in alignment with the aperature in said second end portion when a first of said carriers having a first end portion is abutted against a second of said carriers having a second end portion.

7. The electric circuit set forth in claim 6 wherein each of said carriers are constructed from a material that is a good conductor of thermal energy.

8. The electronic circuit set forth in claim 6 wherein said fastener is passed through the aligned apertures contained in the second end portion of a first carrier and the first end portion of a second carrier when said first carrier and said second carrier are abutted against each other, said fastener retaining said first carrier and said second carrier to said retaining means.

* * * * *